United States Patent
Feudel et al.

(10) Patent No.: US 7,816,199 B2
(45) Date of Patent: Oct. 19, 2010

(54) METHOD OF FORMING A SEMICONDUCTOR STRUCTURE COMPRISING AN IMPLANTATION OF IONS OF A NON-DOPING ELEMENT

(75) Inventors: Thomas Feudel, Radebeul (DE); Manfred Horstmann, Duerrroehrsdorf-Dittersbach (DE); Andreas Gehring, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 51 days.

(21) Appl. No.: 12/037,533

(22) Filed: Feb. 26, 2008

(65) Prior Publication Data
US 2009/0035924 A1 Feb. 5, 2009

(30) Foreign Application Priority Data
Jul. 31, 2007 (DE) .................. 10 2007 035 838

(51) Int. Cl.
*H01L 21/8238* (2006.01)
(52) U.S. Cl. ............... 438/199; 438/305; 257/E21.057; 257/E21.058
(58) Field of Classification Search ........... 438/199, 438/301–308; 257/204, E21.057, E21.058, 257/E21.059, E21.147, E21.148
See application file for complete search history.

(56) References Cited

U.S. PATENT DOCUMENTS

| | | | | |
|---|---|---|---|---|
| 5,933,721 A | * | 8/1999 | Hause et al. | 438/217 |
| 6,376,323 B1 | * | 4/2002 | Kim et al. | 438/373 |
| 6,977,417 B2 | * | 12/2005 | Momiyama et al. | 257/336 |
| 7,253,049 B2 | * | 8/2007 | Lu et al. | 438/231 |
| 2007/0114605 A1 | * | 5/2007 | Dyer et al. | 257/336 |

FOREIGN PATENT DOCUMENTS

DE 196 11 959 A1 3/1997
WO WO 2005/048320 A2 5/2005

OTHER PUBLICATIONS

Translation of Official Communication from German Patent Office for German Patent Application No. 10 2007 035 838.7 dated Oct. 24, 2008.

* cited by examiner

*Primary Examiner*—Khiem D Nguyen
(74) *Attorney, Agent, or Firm*—Williams, Morgan & Amerson

(57) ABSTRACT

A method of forming a semiconductor structure includes providing a substrate having a first feature and a second feature. A mask is formed over the substrate. The mask covers the first feature. An ion implantation process is performed to introduce ions of a non-doping element into the second feature. The mask is adapted to absorb ions impinging on the first feature. After the ion implantation process, an annealing process is performed.

20 Claims, 8 Drawing Sheets

METHOD OF FORMING A SEMICONDUCTOR STRUCTURE COMPRISING AN IMPLANTATION OF IONS OF A NON-DOPING ELEMENT

BACKGROUND OF THE INVENTION

1. Field of the Invention

The present disclosure generally relates to the fabrication of integrated circuits, and, more particularly, to methods of forming a semiconductor structure wherein an annealing process is performed to activate and/or diffuse dopants introduced into a feature formed over a substrate.

2. Description of the Related Art

Integrated circuits comprise a large number of individual circuit elements, such as transistors, capacitors and resistors. These elements are connected by means of electrically conductive lines to form complex circuits such as memory devices, logic devices and micro-processors. The performance of integrated circuits may be improved by increasing the number of functional elements per circuit in order to increase the circuit's functionality and/or by increasing the speed of operation of the circuit elements. A reduction of feature sizes allows the formation of a greater number of circuit elements on the same area, hence increasing the functionality of the circuit, and also reducing signal propagation delays, thus making an increase of the speed of operation of circuit elements possible. Reducing the size of circuit elements such as field effect transistors, however, entails a plurality of issues associated therewith that need to be addressed.

A method of forming a field effect transistor according to the state of the art will be described with reference to FIGS. 1a-1c. FIG. 1a shows a schematic cross-sectional view of a semiconductor structure 100 in a first stage of a method of manufacturing a semiconductor structure according to the state of the art.

The semiconductor structure 100 comprises a substrate 101 which may, for example, comprise a silicon wafer. The substrate 101 may comprise a transistor element 102. The transistor element 102 may comprise an active region 104 which may be formed, for example, by means of techniques of ion implantation well known to persons skilled in the art. As persons skilled in the art know, the doping of the active region 104 may be performed by implanting ions of a dopant material into the substrate 101. A trench isolation structure 103 provides electrical insulation between the transistor element 102 and other circuit elements (not shown) in the semiconductor structure 100. The trench isolation structure 103 may be formed by means of techniques of photolithography, etching, deposition and/or oxidation well known to persons skilled in the art.

The transistor element 102 may further comprise a gate electrode 106 separated from the active region 104 by a gate insulation layer 105. The gate insulation layer 105 may comprise an electrically insulating material such as, for example, silicon dioxide, silicon nitride and/or silicon oxynitride. The gate electrode 106 may, in some examples of methods of forming a semiconductor structure according to the state of the art, comprise polysilicon. The gate insulation layer 105 and the gate electrode 106 may be formed by means of techniques of oxidation, nitridation, deposition and etching that are well known to persons skilled in the art.

After the formation of the gate electrode 106, an ion implantation process may be performed. In the ion implantation process, the semiconductor structure 100 is irradiated with ions of a dopant material, as indicated by arrows 107 in FIG. 1a. A portion of the ions 107 impinging adjacent the gate electrode 106 may be incorporated into the substrate 102 to form an extended source region 108 and an extended drain region 109. Ions 107 impinging on the gate electrode 106 may be absorbed by the gate electrode 106. Hence, substantially no ions are introduced into a portion of the substrate 101 below the gate electrode 106 wherein a channel region of the transistor element 102 is to be formed. The ions absorbed by the gate electrode 106 may form a first doped region 110 in the gate electrode 106.

FIG. 1b shows a schematic cross-sectional view of the semiconductor structure 100 in a later stage of the manufacturing process according to the state of the art. After the formation of the extended source region 108 and the extended drain region 109, a sidewall spacer structure 120 may be formed adjacent the gate electrode 106. As persons skilled in the art know, the sidewall spacer structure 120 may be formed by conformally depositing a layer of an electrically insulating spacer material such as silicon dioxide, silicon oxynitride and/or silicon nitride and anisotropically etching the layer of the spacer material.

Thereafter, a further ion implantation process wherein the semiconductor structure 100 is irradiated with ions 111 of a dopant material may be performed. A portion of the ions 111 impinging adjacent the gate electrode 106 and the sidewall spacer structure 120 may be incorporated into the substrate 101 to form a source region 112 and a drain region 113. A portion of the ions 111 impinging on the gate electrode 106 may be incorporated into the gate electrode 106 to form a second doped region 114 in the gate electrode 106.

FIG. 1c shows a schematic cross-sectional view of the semiconductor structure 100 in a later stage of the manufacturing process according to the state of the art. After the implantation of the ions 111, an annealing process may be performed. In the annealing process, the semiconductor structure 100 may be exposed to an elevated temperature for a predetermined time, for example by inserting the semiconductor structure 100 into a furnace, or by performing a rapid thermal annealing process well known to persons skilled in the art. In the annealing process, the dopants in the extended source region 108, the extended drain region 109, the source region 112, the drain region 113, the first doped region 110 and the second doped region 114 may be incorporated into the crystalline structure of the substrate 101 and the gate electrode 106, respectively, such that they may act as electron donors or acceptors. Furthermore, the dopants may diffuse in the substrate 101 and in the gate electrode 106.

In the substrate 101, which may comprise substantially monocrystalline silicon, the diffusion of the dopants may lead to a blurring of the dopant profile in the extended source region 108, the extended drain region 109, the source region 112 and the drain region 113 created by the implantation of the ions 107, 111. In the gate electrode 106, due to the diffusion of the dopants introduced into the first doped portion 110 and the second doped portion 114, a dopant-rich region 115 may be formed, wherein the extension of the dopant-rich region 115 may differ from the extension of the doped portions 110, 114. Since the dopants may diffuse into portions of the gate electrode 106 in the vicinity of the gate insulation layer 105 only to a limited extent, a region 116 comprising a reduced dopant concentration may be formed in the gate electrode 106 adjacent the gate insulation layer 105.

As persons skilled in the art know, in the operation of the transistor element 102, the gate electrode 106 may be biased to form an inversion layer in a portion of the active region 104 below the gate electrode 106. Due to the reduced dopant concentration in the region 116 of the gate electrode 106, a depletion layer may be formed in the gate electrode 106 adjacent the gate insulation layer 105. The presence of the depletion layer, which may be detected by measuring an inversion gate insulation thickness of the transistor element 102 by means of methods known to persons skilled in the art, may lead to a reduced capacitive coupling between the gate electrode 106 and the channel region formed adjacent the gate insulation layer 105, which may reduce the performance of the transistor element 102.

In the state of the art, it has been proposed to reduce the size of the region 116 comprising the reduced dopant concentration and, hence, the thickness of the depletion layer, by performing a flash lamp annealing or a laser annealing in addition to the furnace annealing process or rapid thermal annealing process described above. The flash lamp or laser annealing process may be performed after the annealing process described above, or after the irradiation of the semiconductor structure 100 with the ions 107, 111. The flash lamp or laser annealing process may induce a diffusion of dopants in the gate electrode 106. Thus, dopant atoms may diffuse into portions of the region 116 comprising the reduced dopant concentration such that the size of the region 116 is reduced. Hence, in the operation of the transistor element 102, the size of the depletion region formed in the gate electrode 106 and the inversion gate insulation thickness associated therewith may be reduced.

Experiments have shown that the additional flash annealing process or laser annealing process, respectively, may improve the performance of N-type field effect transistors. In P-type field effect transistors, however, only a small improvement of the DC performance, which may be determined by measuring a relationship between the saturation current of the transistor and the off-state current of the transistor, may be observed. Moreover, in P-type transistors, the additional flash annealing process or laser annealing process may lead to an increased parasitic gate capacitance and to an increased dynamic power consumption of the transistor element 102. Furthermore, an increase of the gate leakage by about 10-20% may be observed in P-type transistors, which may be attributed to an increase of the electric field strength at the gate insulation layer 105. Hence, the additional flash lamp annealing or laser annealing process may adversely affect the performance of P-type transistor elements.

Therefore, the method of manufacturing a semiconductor structure according to the state of the art, wherein an additional flash lamp annealing process or laser annealing process is performed, which may be used to improve the performance of N-type transistors, may adversely affect the performance of P-type transistors.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment, a method of forming a semiconductor structure comprises providing a semiconductor substrate comprising a first doped feature and a second doped feature. A mask is formed over the substrate. The mask covers the first feature. An ion implantation process is performed to introduce ions of a non-doping element into the second feature. The mask is adapted to absorb ions impinging on the first feature. After the ion implantation process, an annealing process is performed.

According to another illustrative embodiment, a method of forming a semiconductor structure comprises providing a substrate comprising a first transistor element comprising a first gate electrode and a second transistor element comprising a second gate electrode. A first mask is formed over the substrate. The first mask covers the second transistor element. The substrate is irradiated with ions of a first dopant material. The first mask is removed. A second mask is formed over the substrate. The second mask covers the first transistor element. The substrate is irradiated with ions of a second dopant material, and the substrate is irradiated with ions of a non-doping element. The second mask is removed and an annealing process is performed to activate the first dopant material and the second dopant material.

According to yet another illustrative embodiment, a method of forming a semiconductor structure comprises providing a substrate comprising a first transistor element comprising a first gate electrode comprising a first dopant and a second transistor element comprising a second gate electrode comprising a second dopant. A first annealing process adapted to activate the first dopant and the second dopant is performed. A mask is formed over the substrate. The mask covers the first transistor element. An ion implantation process is performed to introduce ions of a non-doping element into the second gate electrode. The mask is adapted to absorb ions impinging on the first transistor element. After the ion implantation process, a second annealing process is performed.

BRIEF DESCRIPTION OF THE DRAWINGS

The disclosure may be understood by reference to the following description taken in conjunction with the accompanying drawings, in which like reference numerals identify like elements, and in which.

Figure 1A:
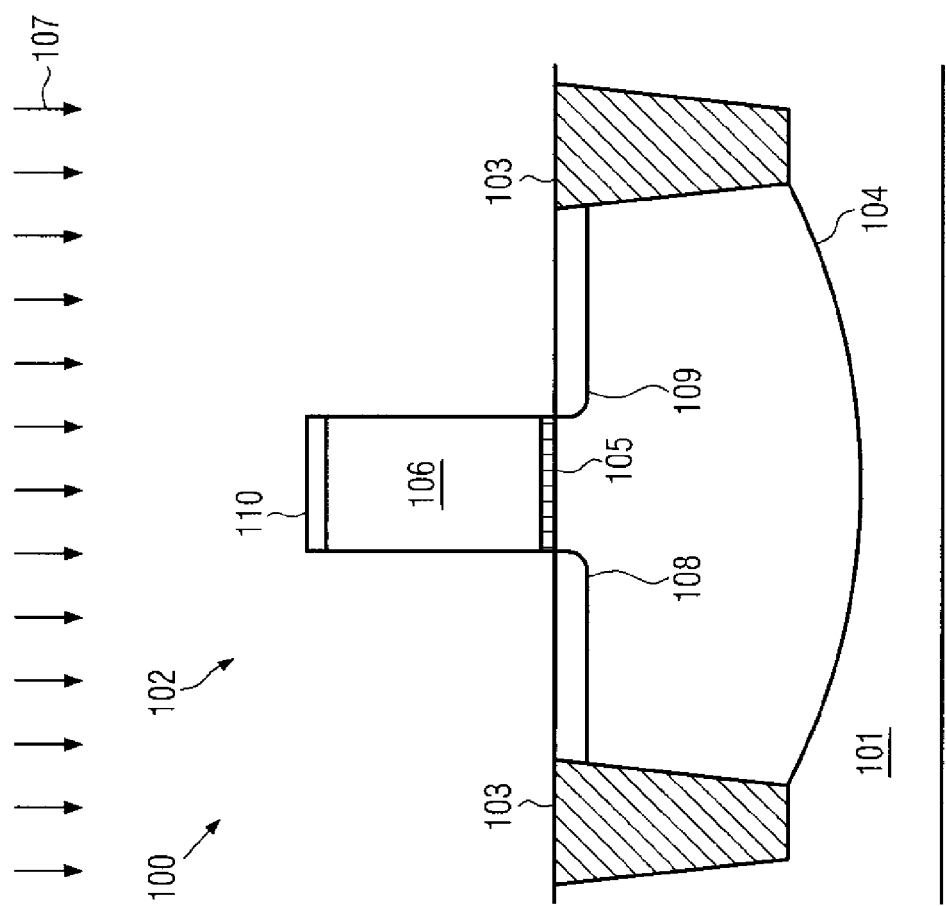
FIGS. 1*a*-1*c* show schematic cross-sectional views of a semiconductor structure in stages of a method of forming a semiconductor structure according to the state of the art.
Figure 1B:
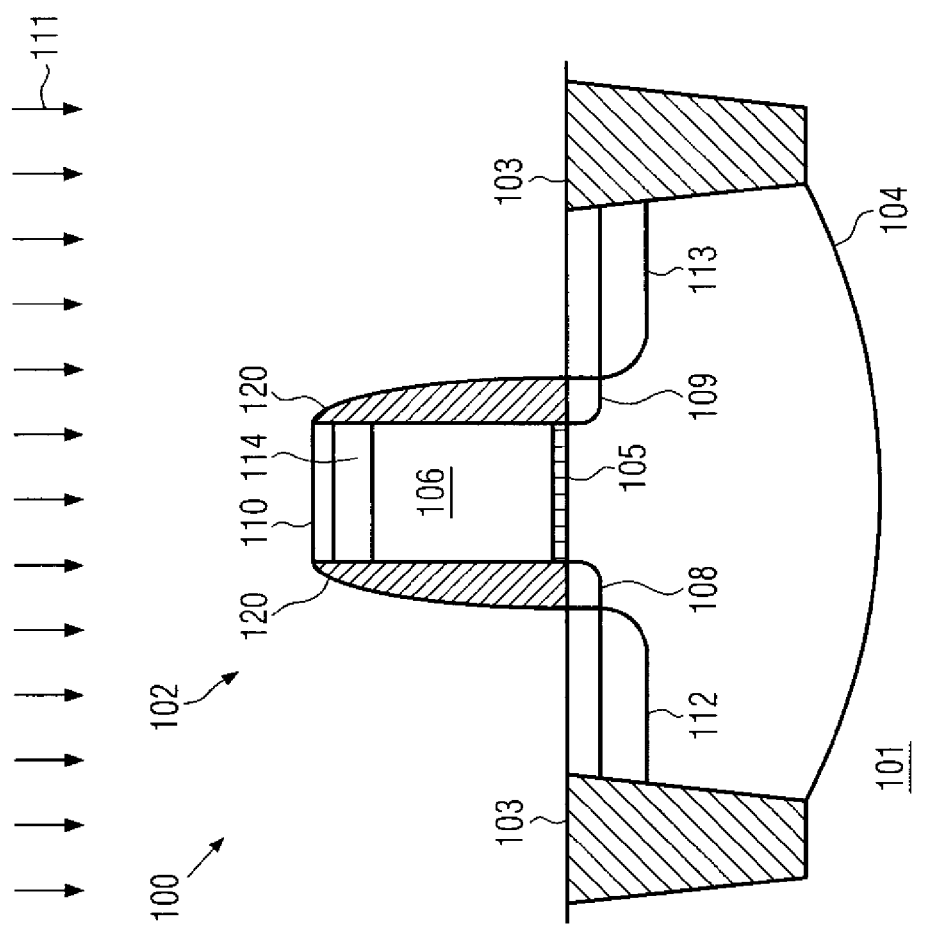
Figure 1C:
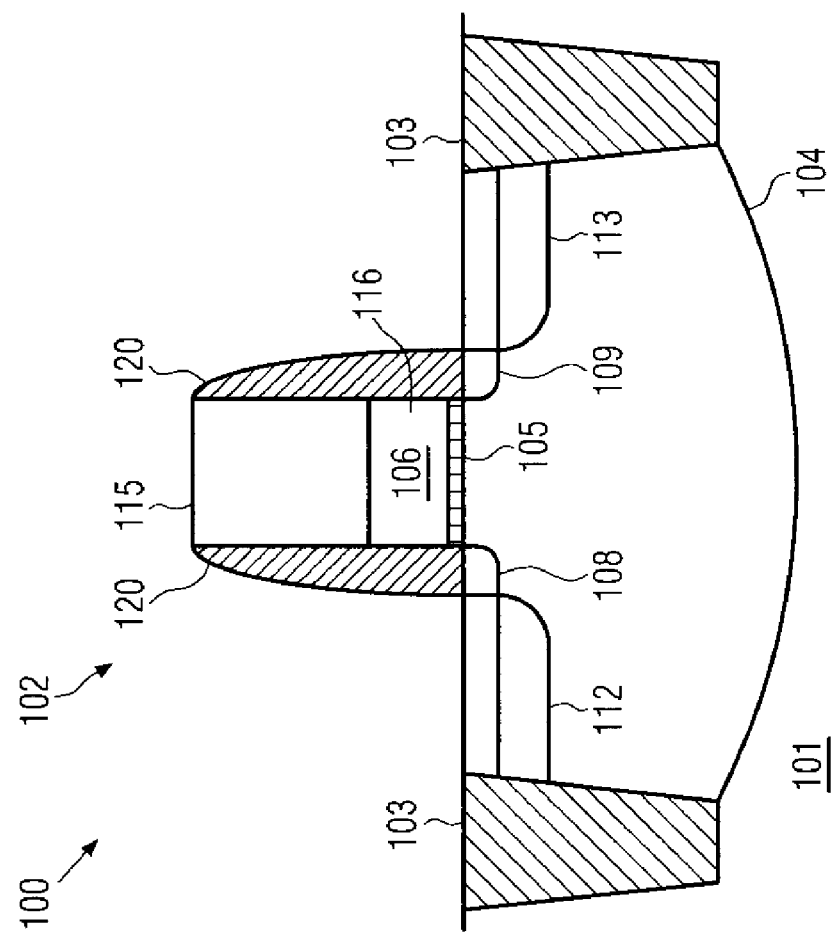

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to one illustrative embodiment, a semiconductor structure comprising a substrate on which a first and a second feature are formed may be provided. The first and the second feature may be gate electrodes of transistor elements. For example, the first feature may be a gate electrode of an N-type transistor and the second feature may be a gate electrode of a P-type transistor. The first feature may be covered by a mask, and an ion implantation may be performed wherein the semiconductor structure is irradiated with ions of a non-doping element, for example nitrogen ions. The mask may protect the first feature from being irradiated with ions. Ions impinging on the second feature may be incorporated into the second feature.

The presence of the non-doping element may modify the physical and/or chemical structure of the second feature. The modification of the physical and/or chemical structure of the second feature may influence the diffusion of dopant material in the second feature. In some embodiments, the first and the second feature may comprise polysilicon. In such embodiments, the non-doping element, when comprising nitrogen, may reduce a diffusion of boron in the second feature during an annealing process performed after the ion implantation process. As persons skilled in the art know, boron, when incorporated into silicon, may act as a P-type dopant.

Since the first feature may be protected by the mask during the ion implantation process, the physical and/or chemical structure of the first feature may remain substantially unmodified by the ion implantation process. Hence, the ion implantation process may have a relatively small influence, or in some cases substantially no influence at all, on the diffusion of dopants in the first feature.

After the ion implantation process, an annealing process, for example a flash lamp annealing process and/or a laser annealing process, may be performed. Due to the modification of dopant diffusion properties in the second feature by the implantation of the ions of the non-doping element, an alteration of the distribution of dopants in the first and the second feature caused by dopant diffusion during the annealing process may be controlled.

In embodiments wherein the first feature comprises a gate electrode of an N-type transistor and the second feature comprises a gate electrode of a P-type transistor, the diffusion of boron in the second feature may be reduced by the presence of the non-doping element. Hence, an extension of a region comprising a reduced dopant concentration in the second feature may be reduced to a less extent than in an annealing process performed without a preceding ion implantation process. Therefore, adverse effects of the annealing process on the performance of the P-type transistor may be reduced or, in some cases, may be substantially avoided. The distribution of dopants in the N-type transistor, however, may be modified by the annealing process, since the diffusion properties of dopants in the first feature may be substantially unmodified by the ion implantation process. Hence, an extension of a region of reduced dopant concentration in the second feature may be reduced by the annealing process to improve the performance of the N-type transistor.

Figure 2A:
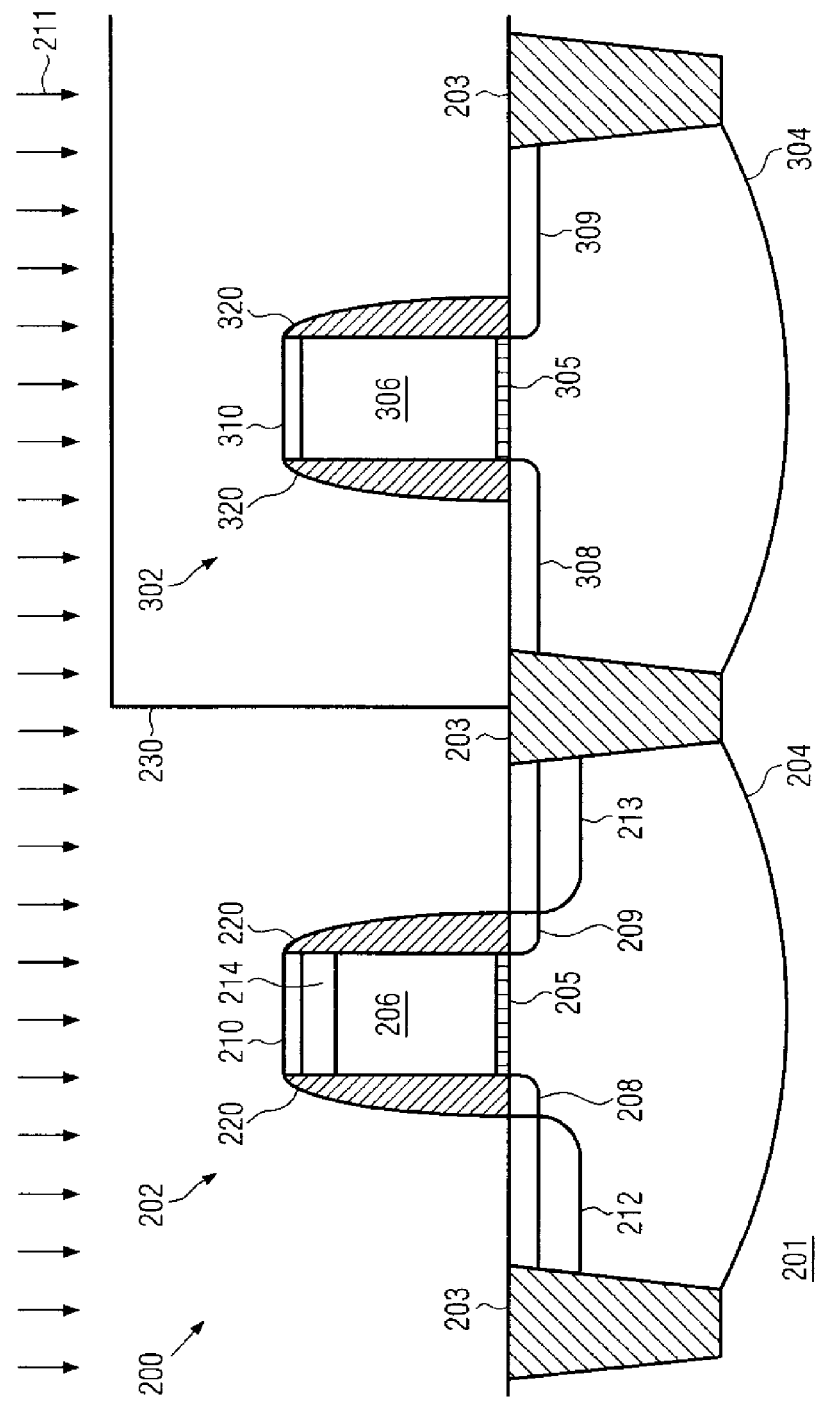
FIGS. 2*a*-2*d* show schematic cross-sectional views of a semiconductor structure in stages of a method of forming a semiconductor structure according to an illustrative embodiment disclosed herein.

FIG. 2a shows a schematic cross-sectional view of a semiconductor structure 200 in a first stage of a method of forming a semiconductor structure according to one illustrative embodiment. The semiconductor structure 200 comprises a substrate 201. The substrate 201 may comprise a semiconductor material, for example silicon, and may be provided in the form of a silicon wafer of a type well known to persons skilled in the art.

In the substrate 201, a first transistor element 202 and a second transistor element 302 may be formed. The first transistor element 202 may comprise an active region 204 and a gate electrode 206 formed over the active region 204 and separated therefrom by a gate insulation layer 205. Similarly, the second transistor element 302 may comprise an active region 304, a gate electrode 306 and a gate insulation layer 305. The gate electrodes 206, 306 may comprise a semiconductor material, for example, polysilicon. A trench isolation structure 203 provides electrical insulation between the first transistor element 202 and the second transistor element 302, and may also provide electrical insulation between the transistor elements 202, 302 and other circuit elements (not shown) in the semiconductor structure 200. These features may be formed by means of techniques of photolithography, etching, deposition, oxidation and ion implantation well known to persons skilled in the art.

In some embodiments, the first transistor element 202 may be an N-type transistor and the second transistor element 302 may be a P-type transistor.

In the first transistor element 202, an extended source region 208 and an extended drain region 209 may be formed. This may be done by means of an ion implantation process well known to persons skilled in the art. In the ion implantation process, the semiconductor structure 200 may be irradiated with ions of a dopant material. In embodiments wherein the first transistor element 202 comprises an N-type transistor, the dopant material may comprise an N-type dopant, such as arsenic. The gate electrode 206 may absorb dopant ions impinging on the gate electrode 206. Thus, a first doped region 210 may be formed in the gate electrode 206. The second transistor element 302 may be covered by a mask (not shown) during the formation of the extended source and drain regions 208, 209. Thus, an implantation of dopant ions into the second transistor element 302 may be substantially avoided.

Thereafter, an extended source region 308 and an extended drain region 309 may be formed in the second transistor element 302. Similar to the formation of the extended source and drain regions 208, 209 in the first transistor element 202, this may be done by means of an ion implantation process wherein the semiconductor structure 200 is irradiated with ions of a dopant material. In embodiments wherein the second transistor element 302 is a P-type transistor, the dopant material may be a P-type dopant, for example boron. Ions impinging on the gate electrode 306 may be absorbed by the gate electrode 306 such that a first doped region 310 is formed in the gate electrode 306. The first transistor element 202 may be protected by a mask (not shown) during the ion implantation process.

After the formation of the extended source regions 208, 308 and the extended drain regions 209, 309, sidewall spacer structures 220, 320 may be formed adjacent the first transistor element 202 and the second transistor element 302, respectively. This may be done by means of methods well known to persons skilled in the art comprising a conformal deposition of a layer of a sidewall spacer material over the semiconductor structure 200 and anisotropically etching the layer of sidewall spacer material. The sidewall spacer structures 220, 320 may comprise a dielectric material such as silicon dioxide, silicon oxynitride and/or silicon nitride.

Subsequently, a mask 230 may be formed over the second transistor element 302. The mask 230 may comprise a photoresist and may be formed by means of techniques of photolithography well known to persons skilled in the art.

Thereafter, an ion implantation process may be performed. In the ion implantation process, the semiconductor structure 200 may be irradiated with ions of a dopant material, as indicated by reference numeral 211 in FIG. 2a. In embodiments wherein the first transistor element 202 comprises an N-type transistor, the ions 211 may comprise ions of an N-type dopant such as arsenic. The ions may impinge on portions of the substrate 201 adjacent the sidewall spacer structure 220. Thus, a source region 212 and a drain region 213 may be formed adjacent the sidewall spacer structure 220. Ions impinging on the gate electrode 206 may be absorbed by the gate electrode 206 to form a second doped region 214 in the gate electrode 206. The mask 230 may protect the second transistor element 302 from being irradiated with the ions 211.

Figure 2B:
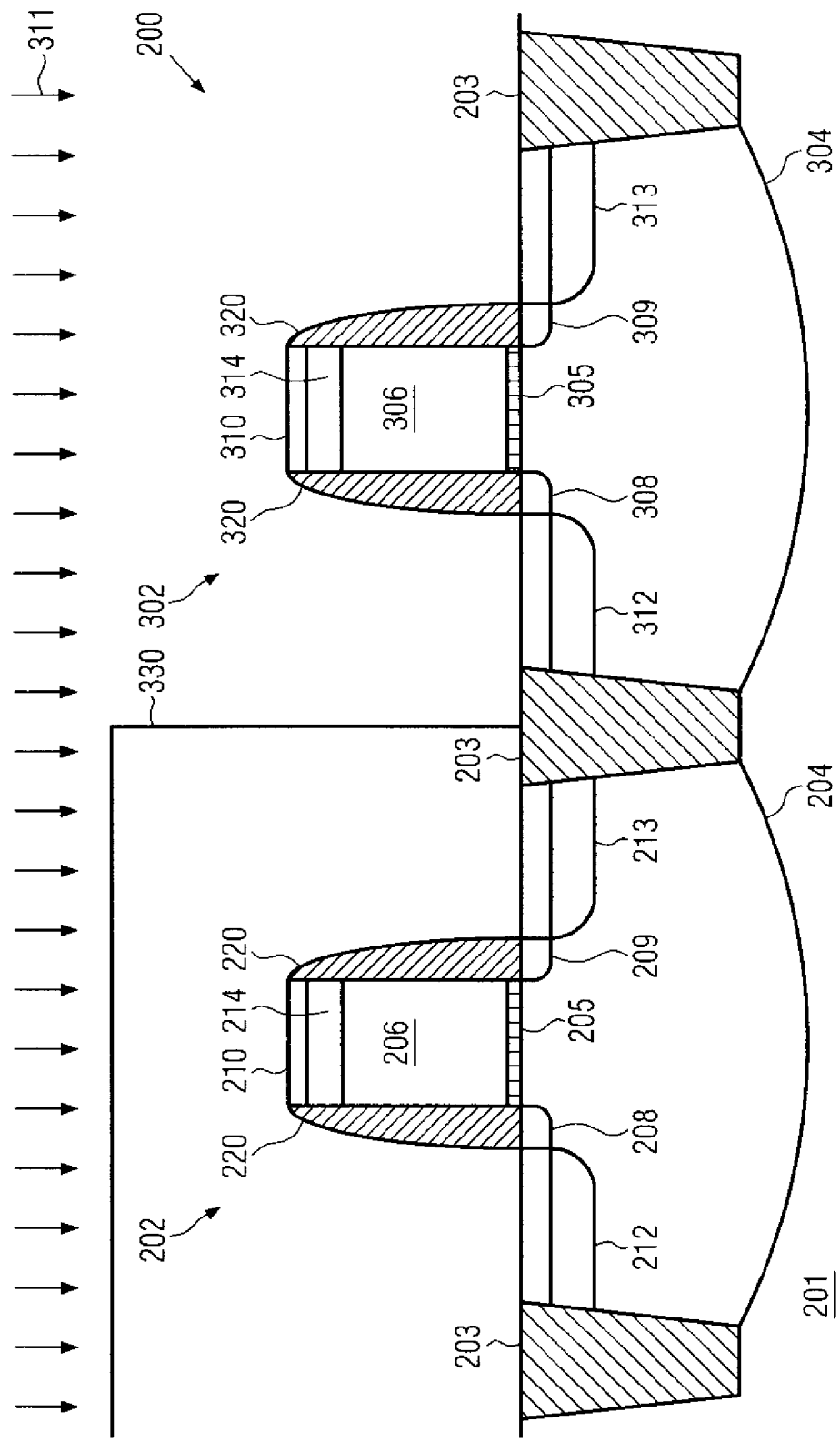

FIG. 2b shows a schematic cross-sectional view of the semiconductor structure 200 in a later stage of the manufacturing process. After the formation of the source region 212, the drain region 213 and the second doped region 214, the mask 230 may be removed, for example, by means of a resist strip process well known to persons skilled in the art. Subsequently, a mask 330 may be formed over the first transistor element 202. Similar to the mask 230, the mask 330 may comprise a photoresist and may be formed by means of techniques of photolithography well known to persons skilled in the art.

After the formation of the mask 330, an ion implantation process wherein the semiconductor structure 200 is irradiated with ions 311 of a dopant material may be performed. In embodiments wherein the second transistor element 302 comprises a P-type transistor, the ions 311 may comprise ions of a P-type dopant, for example, boron ions. Ions impinging adjacent the gate electrode 306 and the sidewall spacer structure 320 may be incorporated into the substrate 201 to form a source region 312 and a drain region 313. Ions impinging on the gate electrode 306 may be incorporated into the material of the gate electrode 306 to form a second doped region 314.

Figure 2C:
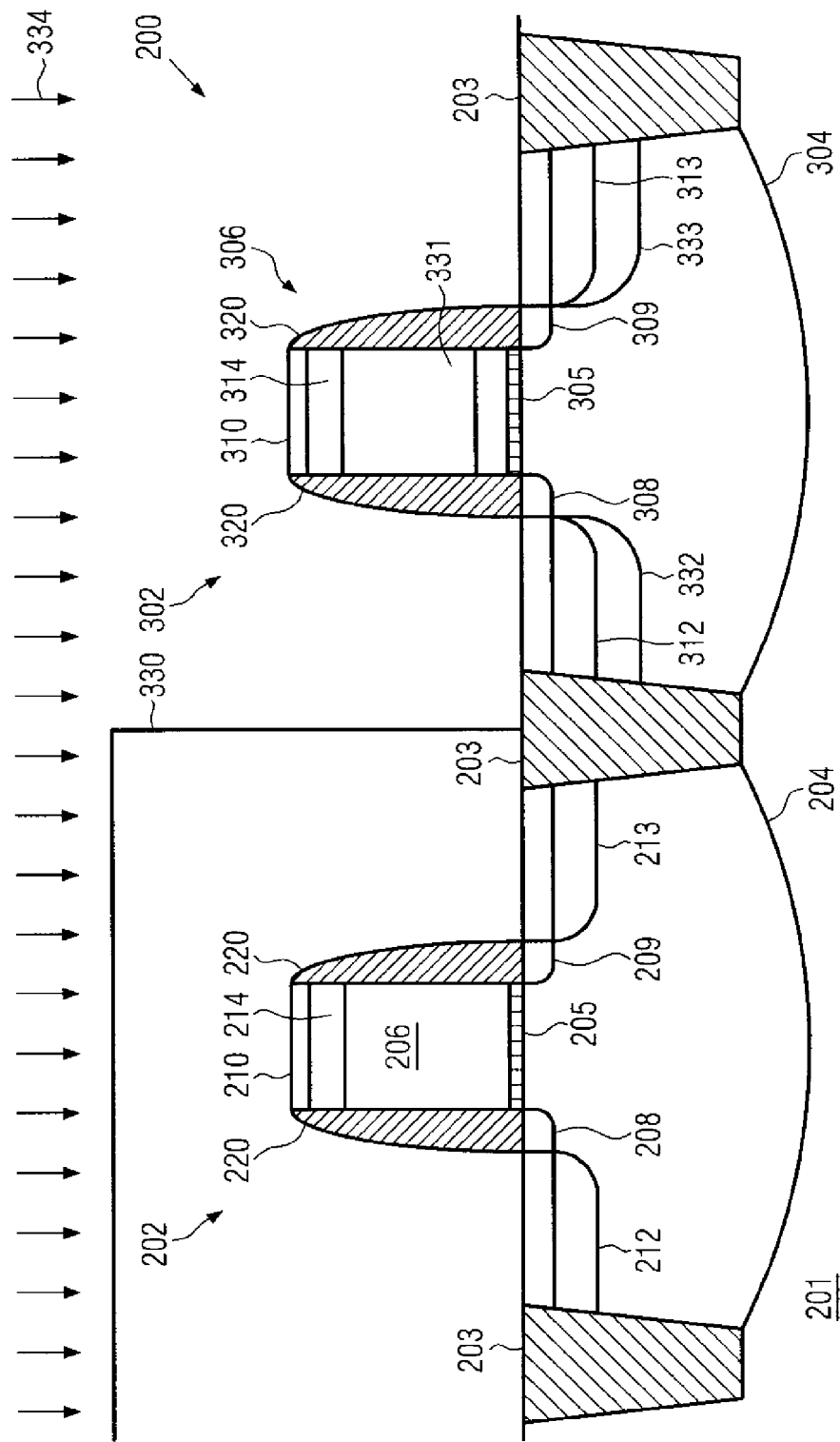

FIG. 2c shows a schematic cross-sectional view of the semiconductor structure 200 in a later stage of the manufacturing process. After the formation of the source region 312, the drain region 313 and the second doped region 314, a further ion implantation process is performed wherein the semiconductor structure 200 is irradiated with ions of a non-doping element, as indicated by reference numeral 334 in FIG. 2c.

In some embodiments, the ions 334 may comprise nitrogen ions. The nitrogen ions may comprise monoatomic nitrogen (N) or diatomic nitrogen ($N_2$). The ion implantation process may be performed by means of an ion implanter of a type well known to persons skilled in the art.

A portion of the ions 334 impinging over the first transistor element 202 may be absorbed by the mask 330, which may remain on the semiconductor structure 200 during the ion implantation process. Hence, the ions 334 may be selectively implanted into the second transistor element 302.

A portion of the ions 334 impinging on the gate electrode 306 may be absorbed by the gate electrode 306 and may be incorporated into the material of the gate electrode 306. Thus, an ion-implanted portion 331 may be formed in the gate electrode 306. Further portions of the ions 334 may impinge adjacent the gate electrode 306 and the sidewall spacer structure 320. Thus, further ion-implanted portions 332, 333 may be formed in the substrate 201.

A shape of the ion-implanted portions 331, 332, 333 may be controlled by varying the energy employed during the ion implant process. An ion impinging on the semiconductor structure 201 may penetrate the semiconductor structure 200. Thereby, the ion may collide with atoms of the semiconductor structure 200. In each collision, the ion loses a portion of its energy until the ion is stopped and incorporated into the semiconductor structure 200. The greater the energy of the ion, the more collisions may be required to stop the ion. Hence, in embodiments wherein the ions 334 have a relatively high energy, the ions 334 may penetrate the gate electrode 306 and/or the substrate 201 to a greater depth than in embodiments wherein the ions 334 have a moderate or relatively low energy. On average, the ions 334 may penetrate the gate electrode 306 and/or the substrate 201 to a characteristic depth which is denoted as "implantation depth."

In some embodiments, the energy of the ions 334 may be adapted such that the implantation depth is smaller than a height of the gate electrode 306. Hence, only a relatively small fraction of the ions 334, or substantially no ions at all, are implanted into the gate insulation layer 305 and/or portions of the substrate 201 below the gate electrode 306. Thus, damages of the gate insulation layer 305 and/or portions of the substrate 201 below the gate electrode 306 wherein the channel region of the second transistor element 306 is to be formed may be substantially avoided.

In some embodiments, the ions 334 may have an energy in a range from about 1-20 keV. A dose of the ions 334 may be in a range from about $1\cdot10^{14}$-$4\cdot10^{15}$ ions/cm$^2$. In some embodiments, the implantation depth of the ions 334 may be adapted such that the spacing between the ion-implanted portion 331 and the gate insulation layer 305 has a value in a range from about 1-10 nm. A concentration of the non-doping element in the ion-implanted portion 331 obtained after the implantation of the ions 334 may have a value in a range from about $10^{19}$-$5\cdot10^{20}$ atoms/cm$^3$. In other embodiments, different numerical values of the parameters may be used.

Figure 2D:
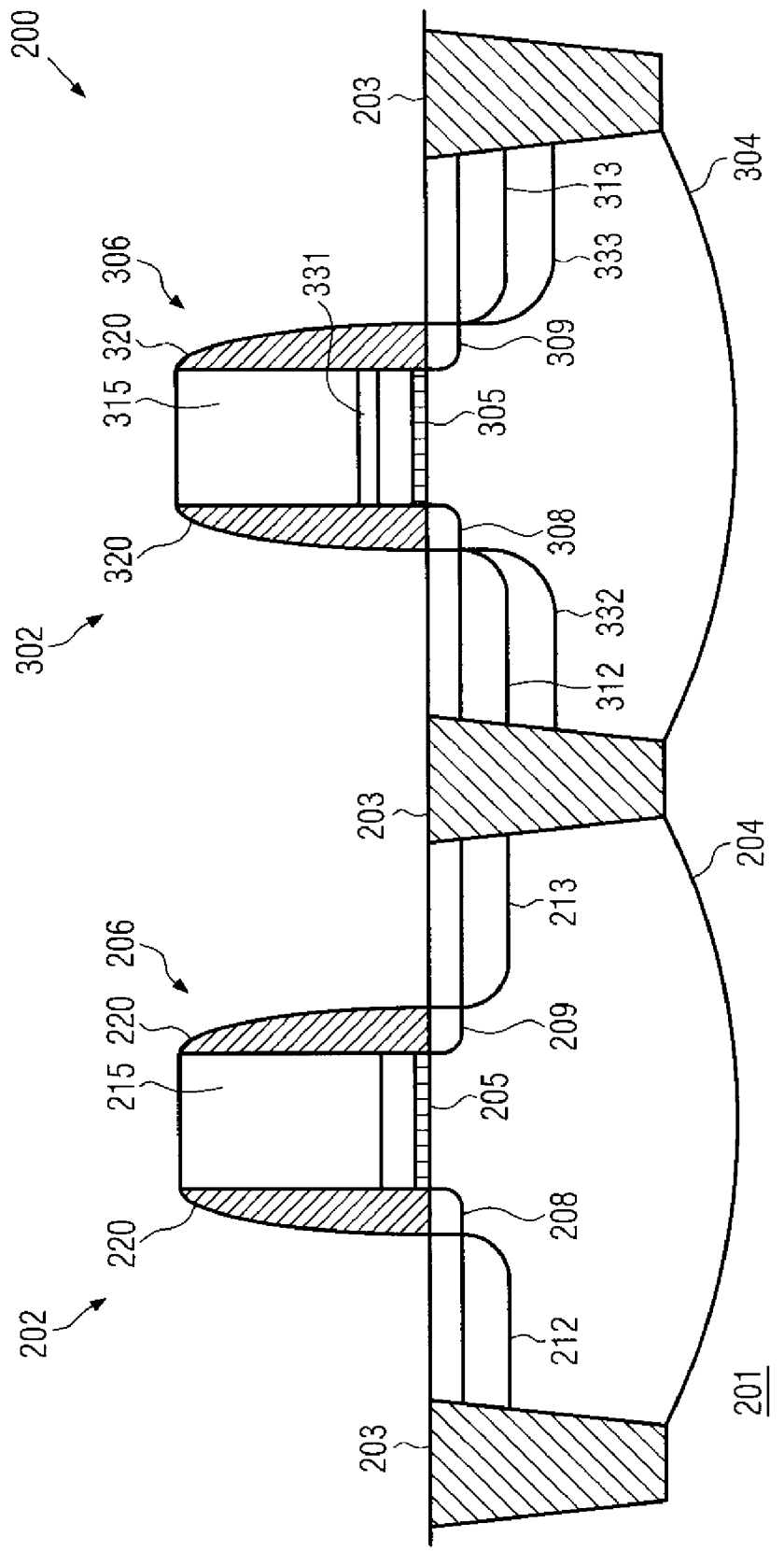

FIG. 2d shows a schematic cross-sectional view of the semiconductor structure 200 in a later stage of the manufacturing process. After the implantation of the ions 334, the mask 330 may be removed from the semiconductor structure 200. This may be done by means of a resist strip process well known to persons skilled in the art.

Subsequently, an annealing process may be performed. In the annealing process, the semiconductor structure 200 may be exposed to an elevated temperature for a predetermined time. Since the diffusion coefficient of dopants in the substrate 201 and in the gate electrodes 206, 306 may be temperature-dependent, wherein the diffusion coefficient may increase with increasing temperature, the annealing process may enhance a diffusion of dopants in the semiconductor structure 200. Moreover, at the elevated temperature, dopant atoms which were not incorporated at sites in the crystal lattice of the substrate 201 or one of the gate electrodes 206, 306 may more easily move to lattice sites at which they may act as electron donors or acceptors. This is denoted as "activation of the dopants."

In some embodiments, the annealing process may comprise a furnace annealing process and/or a rapid thermal annealing process of a type well known to persons skilled in the art. As an alternative to the furnace annealing process and/or the rapid thermal annealing process, or in addition to the furnace annealing process and/or the rapid thermal annealing process, a flash lamp annealing process or a laser annealing process may be performed. Performing a flash lamp annealing process and/or a laser annealing process in addition to a furnace annealing process and/or a rapid thermal annealing process may, under some circumstances, improve the performance of transistor elements.

During the annealing process, the dopants introduced into the first doped regions 210, 310 and the second doped regions 214, 314 of the gate electrodes 206, 306 may diffuse around. Thus, the dopant profile in the gate electrodes 206, 306 may be blurred to some extent such that a dopant-rich region 215 is formed in the gate electrode 206 of the first transistor element 202 and a further dopant-rich region 315 is formed in the gate electrode 306 of the second transistor element 302. The dopant-rich regions 215, 315 may comprise dopant atoms from the first doped regions 210, 310 and the second doped regions 214, 314, wherein the dopant distribution in the dopant-rich regions 215, 315 may differ from the dopant distribution in the first doped regions 210, 310 and the second doped regions 214, 314, respectively.

The dopant diffusion constant in the gate electrode 306 of the second transistor element 302 may be influenced by the presence of the non-doping element in the ion-implanted portion 331. In embodiments wherein the first doped region 310 and the second doped region 314 comprise boron, and the non-doping element comprises nitrogen, the diffusion constant of the dopants in the material of the gate electrode 306 may be reduced, compared to a method of forming a semiconductor structure wherein the implantation of the ions 334 is omitted. Thus, the dopants may diffuse towards the gate insulation layer 305 at a reduced extent. Hence, by irradiating the semiconductor structure 200 with the ions 334, the extension of the dopant-rich region 315 in the gate electrode 306 of the second transistor element 302 may be reduced compared to a method of forming a semiconductor structure wherein the irradiation of the semiconductor structure 200 with the ions 334 of the non-doping element is omitted.

During the operation of the second transistor element 302, the reduced extension of the dopant-rich region 315 may lead to an increased extension of a depletion region which is formed in the gate electrode 306 when a voltage is applied to the gate electrode 306. Thus, adverse effects of a reduction of the size of the depletion region in the gate electrode 306 of the second transistor element 306 which might otherwise occur in embodiments wherein the annealing process comprises a flash lamp annealing process and/or a laser annealing process in addition to a furnace annealing process and/or a rapid thermal annealing process may be reduced or substantially avoided.

The inventors of the present invention have performed experiments wherein a significant increase of the inversion gate insulation thickness, which is related to the thickness of the depletion layer, could be observed in P-type transistors which were formed in accordance with the method described above compared to P-type transistors wherein the implantation of the ions 334 of the non-doping element was omitted. In these experiments, the gate electrodes of the P-type transistors were doped with boron and the non-doping element comprised nitrogen. Depending on the nitrogen dose and the energy of the nitrogen ions, none or only a small DC performance degradation of the P-type transistors was observed, and the reliability of the transistors as well as the dynamic power consumption of the transistors was improved.

For example, in one experiment, the inversion gate insulation thickness could be increased by about 33% by implanting about $1 \cdot 10^{15}$ ions/cm$^2$ of nitrogen at an implantation energy of about 20 keV into a gate electrode of a P-type transistor compared to a P-type transistor wherein the implantation of the non-doping element was omitted. The gate leakage could be reduced by up to about 70%.

Since the first transistor element 202 was protected by the mask 330 during the implantation of the ions 334 of the non-doping element and, hence, substantially no ions of the non-doping element were implanted into the gate electrode 206 of the first transistor element 202, the diffusion of the dopant ions in the first doped region 210 and the second doped region 214 during the annealing process may be substantially unaffected by the implantation of the ions 334 of the non-doping element.

Thus, the size of the dopant-rich region 215 in the gate electrode 206 of the first transistor element 202 may be selectively increased compared to the size of the dopant-rich region 315 in the gate electrode 306 of the second transistor element 302. Hence, the size of the depletion region which may be formed during the operation of the first transistor element 202 if a voltage is applied to the gate electrode 206 may be reduced compared to the size of the depletion region formed in the gate electrode 306 of the second transistor element 302. This may improve the performance of the semiconductor structure 200 in embodiments wherein the first transistor element 202 comprises an N-type transistor and the second transistor element 302 comprises a P-type transistor.

In other embodiments, the implantation of ions of the non-doping element may be performed between a first annealing process and a second annealing process, wherein the first annealing process is performed after the formation of the source regions 212, 312, the drain regions 213, 313 and the doped regions 210, 214, 310, 314. One such embodiment will be described in the following with reference to FIG. 3.

Figure 3:
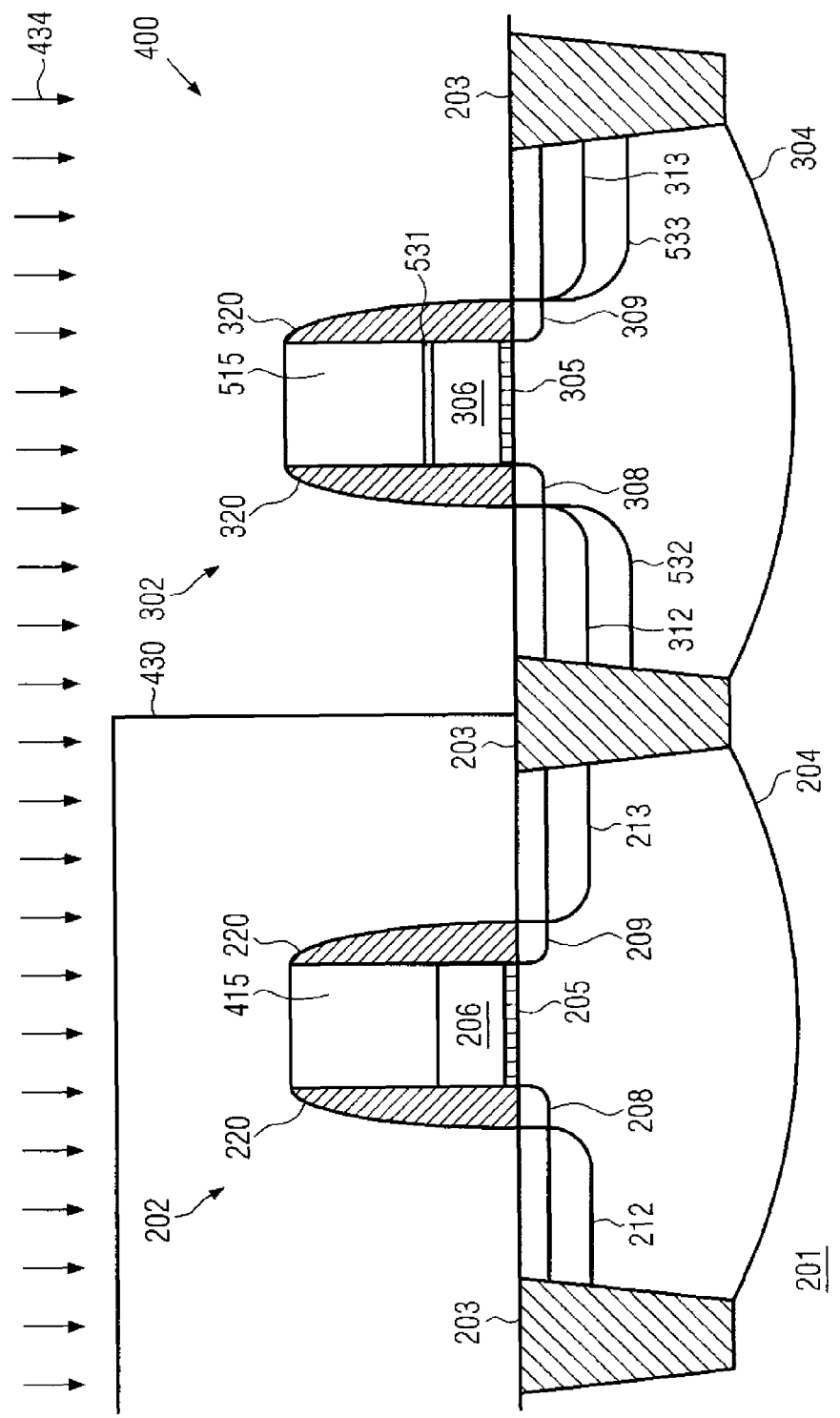
FIG. 3 shows a schematic cross-sectional view of a semiconductor structure in a stage of a method of forming a semiconductor structure according to another illustrative embodiment disclosed herein.

FIG. 3 shows a schematic cross-sectional view of a semiconductor structure 400 in a stage of a method of forming a semiconductor structure according to one illustrative embodiment. For convenience, in FIG. 3 and in FIGS. 2a-2d, like reference numerals have been used to denote like components.

The semiconductor structure 400 comprises a substrate 201. In the substrate 201, a first transistor element 202 and a second transistor element 302, which are separated and electrically insulated from each other by a trench isolation structure 203, are formed. In some embodiments, the first transistor element 202 may be an N-type transistor and the second transistor element 302 may be a P-type transistor. The first transistor element 202 comprises an active region 204 and a gate electrode 206 which are separated from each other by a gate insulation layer 205. Adjacent the gate electrode 206, a sidewall spacer structure 220 may be formed. The first transistor element 202 further comprises an extended source region 208, an extended drain region 209, a source region 212 and a drain region 213. Similarly, the second transistor element 302 comprises an active region 304, a gate electrode 306, a gate insulation layer 305, a sidewall spacer structure 320, an extended source region 308, an extended drain region 309, a source region 312 and a drain region 313. The gate electrodes 206, 306 may comprise a semiconductor material, for example polysilicon. These features may be formed by means of methods of photolithography, etching, deposition, oxidation and ion implantation processes well known to persons skilled in the art.

In particular, the extended source regions 208, 308, the extended drain regions 209, 309, the source regions 212, 312 and the drain regions 213, 313 may be formed by means of ion implantation processes wherein the semiconductor structure 400 is irradiated with ions of a dopant material. In these ion implantation processes, the first transistor element 202 may be covered by a mask (not shown) while ions are implanted into the second transistor element 302, and the second transistor element 302 may be covered by a mask (not shown) while ions are implanted into the first transistor element 202. Hence, different types of dopants may be implanted into the first transistor element 202 and the second transistor element 302. In these ion implantation processes, portions of the dopant ions may impinge on the gate electrodes 206, 306 such that portions of the gate electrodes 206, 306 are doped.

In embodiments wherein the first transistor element 202 is an N-type transistor and the second transistor element 302 is a P-type transistor, the gate electrode 206, as well as the extended source and drain regions 208, 209 and the source and drain regions 212, 213, of the first transistor element 202 may comprise an N-type dopant, such as arsenic, and the gate electrode 306, as well as the extended source and drain regions 308, 309 and the source and drain regions 312, 313, of the second transistor element 302 may comprise a P-type dopant, such as boron.

After the formation of the extended source regions 208, 308, the extended drain regions 209, 309, the source regions 212, 312 and the drain regions 213, 313, a first annealing process may be performed. In the first annealing process, which may comprise a furnace annealing process and/or a rapid thermal annealing process known to persons skilled in the art, the semiconductor structure 400 may be exposed to an elevated temperature for a predetermined time. In the annealing process, dopants in the gate electrodes 206, 306, in the extended source and drain regions 208, 209, 308, 309 and in the source and drain regions 212, 213, 312, 313 may be activated and may diffuse around. After the annealing process, the dopants in the gate electrode 206 of the first transistor element 202 may be distributed over a dopant-rich region 415 and the dopants in the gate electrode 306 of the second transistor element 302 may be distributed over a dopant-rich region 515. Below the dopant-rich regions 415, 515, regions having a smaller dopant concentration than the dopant-rich regions 415, 515 may be formed.

The process steps described above may be performed in accordance with methods of manufacturing a semiconductor structure well known to persons skilled in the art, wherein no specific adaptations of the process steps are required. Hence, advantageously, well-established known process recipes may be used.

After the first annealing process, a mask 430 may be formed over the first transistor element 202. The mask 430 may comprise a photoresist and may be formed by means of methods of photolithography well known to persons skilled in the art.

Thereafter, an ion implantation process wherein the semiconductor structure 400 is irradiated with ions 434 of a non-doping element, for example with nitrogen ions, may be performed. Features of the ion implantation process may correspond to those of the irradiation of the semiconductor structure 200 with the ions 334 described above with reference to FIGS. 2a-2d. Due to the irradiation of the semiconductor structure 400 with the ions 434 of the non-doping element, ion-irradiated portions 531, 532, 533 may be formed in the gate electrode 306 of the second transistor element 302 and in the substrate 201.

After the implantation of the ions 434, the mask 430 may be removed by means of a known resist strip process and a second annealing process may be performed. The second annealing process may comprise a flash lamp annealing process or a laser annealing process. In the second annealing process, an activation of the dopants in the gate electrodes 206, 306, the extended source and drain regions 208, 209, 308, 309, and the source and drain regions 212, 213, 312, 313 may be improved. Moreover, during the second annealing process, a diffusion of the dopants may occur.

Since the first transistor element 202 was covered by the mask 430 during the second annealing process, and was protected from an irradiation with the ions 434 by the mask 430, substantially no atoms of the non-doping element may be present in the first transistor element 202. Therefore, a diffusion of dopants in the gate electrode 206 of the first transistor element 202 may be substantially unaffected by the implantation of the ions 434 into the semiconductor structure 400.

Therefore, dopants in the gate electrode 206 of the first transistor element 202 may diffuse towards the gate insulation layer 205, and an extension of the dopant-rich region 415 in the first transistor element 202 may increase. Hence, an extension of a depletion region obtained in the gate electrode 206 during the operation of the first transistor element 202 may be reduced, which may be particularly advantageous in embodiments wherein the first transistor element 202 is an N-type transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
   providing a semiconductor substrate comprising a first doped gate electrode and a second doped gate electrode, the first doped gate electrode comprising a first doped radon separated from a first gate insulation layer by a first depletion layer and the second doped gate electrode comprising a second doped region separated from a second gate insulation layer by a second depletion layer;
   forming a mask over said substrate, said mask covering said first doped gate electrode;
   performing an ion implantation process to introduce ions of a non-doping element into said second doped gate electrode, the non-doping element reducing dopant diffusion in said second doped gate electrode, and said mask being adapted to absorb ions impinging on said first doped gate electrode; and performing an annealing process after said ion implantation process, wherein dopant diffusion in said second doped gate electrode is reduced relative to dopant diffusion in said first doped gate electrode by the presence of the non-doping element in said second doped gate electrode so that a first thickness of the first depletion layer is less than a second thickness of the second depletion layer following the annealing process.

2. The method of claim 1, wherein said non-doping element comprises nitrogen, and wherein the ion implantation process is performed such that an implantation depth in said second doped gate electrode is smaller than a height of the second doped gate electrode.

3. The method of claim 2, wherein said ion implantation process is performed at an ion energy in a range from about 1-20 keV, the ion energy being selected to reduce an extension of a region of reduced dopant concentration in said second gate electrode to a lesser extent relative to an extension of a region of reduced dopant concentration in said first gate electrode.

4. The method of claim 2, wherein a dose of said ions is in a range from about $1 \times 10^{14}$-$4 \times 10^{15}$ ions/cm$^2$, the dose being selected to reduce an extension of a region of reduced dopant concentration in said second gate electrode to a lesser extent relative to an extension of a region of reduced dopant concentration in said first gate electrode.

5. The method of claim 1, wherein said first doped gate electrode comprises a gate electrode of a first transistor element and said second doped gate electrode comprises a gate electrode of a second transistor element, and wherein said first transistor element is an N-type transistor and said second transistor element is a P-type transistor.

6. The method of claim 1, wherein said annealing process comprises flash lamp annealing.

7. The method of claim 1, wherein said annealing process comprises laser annealing.

8. The method of claim 1, further comprising performing a second ion implantation process adapted to introduce ions of a dopant material into said second doped gate electrode, said second ion implantation process being performed after said formation of said mask such that said mask protects said first doped gate electrode from being irradiated with said ions of said dopant material.

9. The method of claim 1, wherein said provision of said semiconductor structure comprises doping said first doped gate electrode with a first dopant, doping said second doped gate electrode with a second dopant and performing a second annealing process, said doping of said first doped gate electrode, said doping of said second doped gate electrode and said second annealing process being performed before said formation of said mask.

10. A method of forming a semiconductor structure, comprising:

providing a substrate comprising a first transistor element comprising a first gate electrode and a second transistor element comprising a second gate electrode the first gate electrode comprising a first doped region separated from a first gate insulation layer by a first depletion layer and the second gate electrode comprising a second doped region separated from a second gate insulation layer by a second depletion layer;

forming a first mask over said substrate, said first mask covering said second transistor element;

irradiating said substrate with ions of a first dopant material;

removing said first mask;

forming a second mask over said substrate, said second mask covering said first transistor element;

irradiating said substrate with ions of a second dopant material;

irradiating said substrate with ions of a non-doping element to reduce dopant diffusion in said second doped gate electrode;

removing said second mask; and performing an annealing process adapted to activate said first dopant material and said second dopant material, wherein dopant diffusion in said second gate electrode is reduced relative to dopant diffusion in said first gate electrode by the presence of the non-doping element in said second doped gate electrode so that a first thickness of the first depletion layer is less than a second thickness of the second depletion layer following the annealing process.

11. The method of claim 10, wherein said non-doping element comprises nitrogen, and wherein the ion implantation process is performed such that an implantation depth in said second doped gate electrode is smaller than a height of the second doped gate electrode.

12. The method of claim 11, wherein said ions of said non-doping element have an ion energy in a range from about 1-20 keV, the ion energy being selected to reduce an extension of a region of reduced dopant concentration in said second gate electrode to a lesser extent relative to an extension of a region of reduced dopant concentration in said first gate electrode.

13. The method of claim 11, wherein a dose of said ions of said non-doping element is in a range from about $1 \times 10^{14}$-$4 \times 10^{15}$ ions/cm$^2$, the dose being selected to reduce an extension of a region of reduced dopant concentration in said second gate electrode to a lesser extent relative to an extension of a region of reduced dopant concentration in said first gate electrode.

14. The method of claim 10, wherein said first transistor element is an N-type transistor and said second transistor element is a P-type transistor.

15. The method of claim 10, wherein said annealing process comprises flash lamp annealing.

16. The method of claim 10, wherein said annealing process comprises laser annealing.

17. The method of claim 10, further comprising performing a second annealing process, said second annealing process comprising at least one of furnace annealing and rapid thermal annealing.

18. A method of forming a semiconductor structure, comprising:

providing a substrate comprising a first transistor element comprising a first gate electrode comprising a first dopant in a first doped region separated from a first gate insulation layer by a first depletion layer and a second transistor element comprising a second gate electrode comprising a second dopant in a second doped region separated from a second gate insulation layer by a second depletion layer;

performing a first annealing process adapted to activate said first dopant and said second dopant;

forming a mask over said substrate, said mask covering said first transistor element;

performing an ion implantation process to introduce ions of a non-doping element into said second gate electrode to reduce diffusion of the second dopant in said second doped gate electrode, said mask being adapted to absorb ions impinging on said first transistor element; and performing a second annealing process after said ion implantation process, wherein diffusion of the second dopant in said second gate electrode is reduced relative to diffusion of the first dopant in said first gate electrode by the presence of the non-doping element in said second doped gate electrode, so that a first thickness of the first depletion layer is less than a second thickness of the second depletion layer following the second annealing process.

19. The method of claim 18, wherein said non-doping element comprises nitrogen, and wherein the ion implantation process is performed such that an implantation depth in said second doped gate electrode is smaller than a height of the second doped gate electrode.

20. The method of claim 18, wherein said second annealing process comprises at least one of flash lamp annealing and laser annealing.

* * * * *